US009130597B2

(12) United States Patent
Cooke

(10) Patent No.: US 9,130,597 B2
(45) Date of Patent: Sep. 8, 2015

(54) NON-VOLATILE MEMORY ERROR CORRECTION

(71) Applicant: Laurence H. Cooke, Los Gatos, CA (US)

(72) Inventor: Laurence H. Cooke, Los Gatos, CA (US)

(*) Notice: Subject to any disclaimer, the term of this patent is extended or adjusted under 35 U.S.C. 154(b) by 379 days.

(21) Appl. No.: 13/667,298

(22) Filed: Nov. 2, 2012

(65) Prior Publication Data
US 2014/0115423 A1   Apr. 24, 2014

Related U.S. Application Data

(63) Continuation of application No. 13/659,368, filed on Oct. 24, 2012, now abandoned.

(51) Int. Cl.
H03M 13/00 (2006.01)
H03M 13/29 (2006.01)
H03M 13/15 (2006.01)
G06F 11/10 (2006.01)
H03M 13/11 (2006.01)
H03M 13/09 (2006.01)

(52) U.S. Cl.
CPC ....... *H03M 13/2909* (2013.01); *G06F 11/1012* (2013.01); *H03M 13/15* (2013.01); *H03M 13/2927* (2013.01); *H03M 13/09* (2013.01); *H03M 13/11* (2013.01); *H03M 13/151* (2013.01)

(58) Field of Classification Search
CPC ... H03M 13/11; H03M 13/09; H03M 13/091; H03M 13/15; H03M 13/151; H04L 1/0061; H04L 1/0057

USPC .......................................... 714/752, 758, 781
See application file for complete search history.

(56) References Cited

U.S. PATENT DOCUMENTS

| 3,685,014 | A | * | 8/1972 | Hsiao et al. ................. 714/753 |
| 4,316,285 | A | * | 2/1982 | Bobilin et al. ............... 370/512 |
| 5,479,638 | A | | 12/1995 | Assar et al. |
| 5,553,082 | A | | 9/1996 | Connor et al. |
| 5,729,559 | A | * | 3/1998 | Bright et al. ................ 714/786 |
| 5,732,066 | A | * | 3/1998 | Moriya et al. ............ 369/59.26 |
| 5,930,359 | A | | 7/1999 | Kempke et al. |
| 6,601,211 | B1 | | 7/2003 | Norman |
| 6,640,327 | B1 | | 10/2003 | Hallberg |
| 6,732,221 | B2 | | 5/2004 | Ban |
| 6,910,174 | B2 | | 6/2005 | Keeler |
| 7,369,422 | B2 | | 5/2008 | Cooke |
| 7,412,636 | B2 | | 8/2008 | Cooke |

(Continued)

OTHER PUBLICATIONS

International Search Report and Written Opinion issued is corresponding PCT Patent Application No. PCT/US2013/066540, date of mailing May 2, 2014.

(Continued)

*Primary Examiner* — Albert Decady
*Assistant Examiner* — Osman Alshack
(74) *Attorney, Agent, or Firm* — Panitch Schwarze Belisario & Nadel LLP

(57) ABSTRACT

Improving the performance, life and amount of data storage in write limited non-volatile memory may be achieved by: a) utilizing a serial content-addressable memory (CAM) to perform logical address translation, b) a minimum CAM function to perform erase error count wear leveling, c) increasingly refining a two dimensional error-correction coding (ECC) method as needed to correct for degrading storage, and/or d) serially generating ECC and using an ECC serial decoder to correct the data.

2 Claims, 16 Drawing Sheets

(56) References Cited

U.S. PATENT DOCUMENTS

| | | |
|---|---|---|
| 7,421,563 B2 | 9/2008 | Cooke |
| 8,001,318 B1 | 8/2011 | Iyer et al. |
| 8,010,876 B2 | 8/2011 | Hsieh et al. |
| 2001/0048613 A1 | 12/2001 | Al-Shamma et al. |
| 2004/0123199 A1* | 6/2004 | Tan ............................. 714/728 |
| 2004/0123223 A1* | 6/2004 | Halford ....................... 714/781 |
| 2007/0050596 A1* | 3/2007 | Cooke .......................... 711/216 |
| 2007/0195570 A1 | 8/2007 | Hager Cooke |
| 2008/0016427 A1* | 1/2008 | Namekawa et al. .......... 714/758 |
| 2008/0209121 A1 | 8/2008 | Cooke |
| 2009/0106523 A1 | 4/2009 | Steiss |
| 2010/0122025 A1 | 5/2010 | Fusella et al. |
| 2011/0022931 A1 | 1/2011 | Eleftheriou et al. |
| 2011/0138103 A1 | 6/2011 | Iiiadis et al. |

OTHER PUBLICATIONS

Office Action issued Jun. 25, 2014 in U.S. Appl. No. 13/659,368.

* cited by examiner

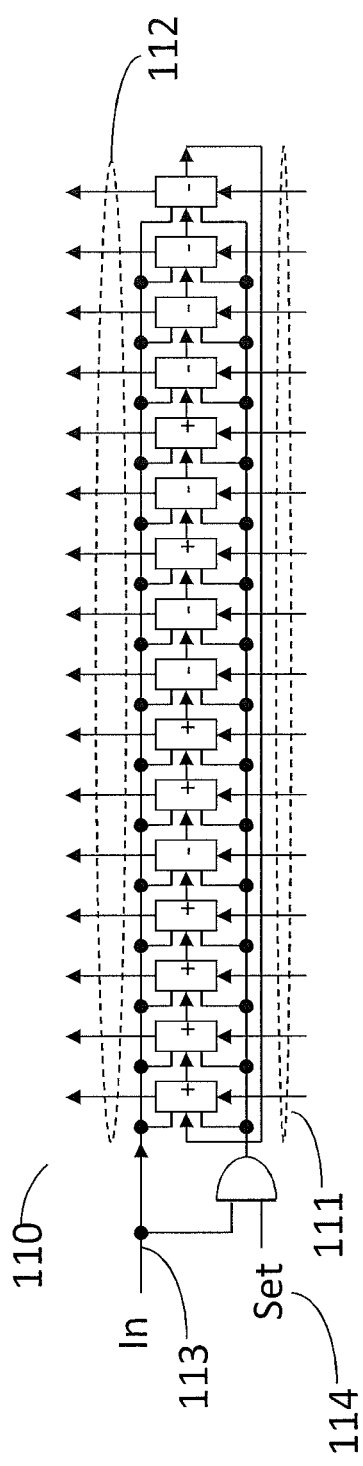
Figure 11
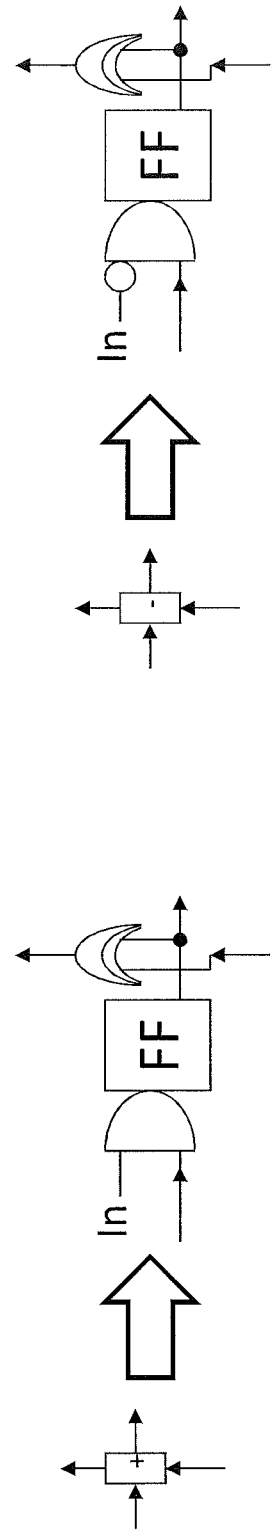
Figure 12a
Figure 12b

NON-VOLATILE MEMORY ERROR CORRECTION

CROSS-REFERENCE TO RELATED APPLICATIONS

This application is a continuation of U.S. patent application Ser. No. 13/659,368, filed on Oct. 24, 2012, which is incorporated by reference herein. This application is also related to U.S. patent application Ser. No. 13/667,352, filed on Nov. 2, 2012, having the same title as the present application, and also incorporated herein by reference.

FIELD OF THE INVENTION

Flash and/or Phase Change Memories tend to fail after a limited number of write cycles. Embodiments of the present invention may pertain to minimizing and correcting read errors in such non-volatile storage. More specifically, such embodiments may pertain to a combination of techniques, such as modified wear leveling, varying orthogonal error correction with defect levels, and/or logical to physical address mapping utilizing a serial Content Addressable Memory (CAM).

BACKGROUND OF THE INVENTION

Non-volatile (NV) memories, such as electrically erasable programmable read only memories (EEPROMs) or NOR and NAND Flash memories typically have limited write cycles before failing, and may exhibit adjacent bit failures after too many read cycles. In NV memory, reads tend to be more robust than writes, so most uses of these memories have been in read-intensive modes such as streaming audio and video, but recent developments have seen an increasing use of Flash Memories in Solid State Disks (SSDs), which require a higher frequency of writes and much higher data integrity. As such, there are numerous patents, such as U.S. Pat. No. 6,601,211 by Norman, granted Jul. 29, 2003, and U.S. Pat. No. 8,010,876 by Hsieh et al., granted Aug. 30, 2011, which describe including Error Correction Codes (ECC) in each page of memory to detect and correct flash read errors. In addition, Keeler suggests a two-dimensional application of ECC to blocks of data storage in U.S. Pat. No. 6,910,174, granted Jun. 21, 2005. The present inventor has been granted a number of patents, including U.S. Pat. No. 7,412,636, granted Aug. 12, 2008, U.S. Pat. No. 7,421,563 granted Sep. 2, 2008, and their continuations, all of which may be applicable to serial ECC generation and error correction.

Still, block erasures and page or word writes, where blocks may be much larger than the pages or words, may fail after a number of cycles. To extend this limited life, numerous patents, such as U.S. Pat. No. 6,732,221 by Ban, granted May 4, 2004, and U.S. Pat. No. 8,001,318 by Iyer et al., granted Aug. 16, 2011, describe techniques called wear leveling. Wear leveling may be used to reduce the maximum number of write cycles to any specific block of memory by writing to unused memory before erasing and reusing previously used memory.

As the non-volatile memory wears out, the errors increase. Individual pages may fail on write or read cycles, and whole blocks may fail on erasure. These failures may constitute an accumulation of individual bit failures after any given operation. As the number of these bit failures increase, ECC may no longer correct them. In some systems these pages or blocks may be marked bad and removed from the available storage. In such systems, the memory capacity appears to reduce as the NV memory begins to wear out. Some NV memory systems begin with failures, which may be marked as bad blocks or pages before being used.

FIG. 1 is a high-level diagram of a typical system for managing these forms of error correction. The system may include NV memory 10 and a microprocessor 14 that performs the ECC generation and error correction, and which translates the incoming control and logical addresses 15 from the host into physical addresses for accessing the NV memory 10, as required for the wear leveling process. The microprocessor keeps the address translation tables and copies of the lists of bad pages and blocks in the volatile Random Access Memory (RAM) 11.

Non-volatile memories, such as phase-change memories or flash memories, are typically slower than volatile memory such as Static RAM (SRAM) or Dynamic RAM (DRAM). In order to improve the read-write performance of the NV memory 10, the RAM 11 is employed to temporarily hold the recently accessed data, for transmission either to the NV memory 12 or to the external host 13.

One patent, U.S. Pat. No. 5,479,638 by Assar et al. granted Dec. 26, 1995, suggests applying traditional CAMs to a wear leveling technique to reduce the read latency. The inventor has previously patented a serial CAM structure in U.S. Pat. No. 7,369,422 granted May 6, 2008, which has the advantage of using a regular two-port memory.

Such techniques have resulted in a multi-chip solution, which tracks the use of NV memory, not the actual errors due to its use. It is known that these errors increase gradually, and eventually make the blocks and pages unusable, and it is also known that while errors increase with use, they may otherwise be very random. And yet none of the current methods measure the actual errors or attempt to continue to use defective storage, beyond simple error correction.

SUMMARY OF EMBODIMENTS OF THE INVENTION

As such, various embodiments in this disclosure may address ways to improve the error measurement and storage selection to minimize data errors, while selectively increasing the error correction capability to correct increasingly defective NV memory, which may help to improve the life and usage of the NV memory.

An organization to facilitate such improved life and usage of the NV memory may contain various record types including Data, Erased, Fix and Deleted.

The next available record, selected by minimum error count, may employ serial CAM logic to perform the minimum selection.

The next block to erase may be chosen by selecting the block with a minimum combination of total error count and number of used records.

Serial CAM logic may also be used to perform the logical to physical address translation. The serial CAM logic may select one or many records with the same logical address, and the number of selected records may be used to detect errors in the logical address.

Pages of user data may be stored in Data records, and each page's ECC segments may be stored in Fix records, where the number of Fix records may be increased to correspondingly increase the error correction capability as needed to cover the known errors in the records. The increased number of ECC segments may be applied to successively smaller slices of data. The ECCs may correct single or multiple bits, and may be correcting vertical or horizontal slices of the data.

An initial number of Fix records for a page of data may be determined by the total error count of the data records, which may be calculated using serial CAM logic.

A process of repeatedly checking and correcting vertical and horizontal slices of data may be used to correct excessive vertical and/or horizontal defects, which may not be correctable by individual ECC segments. When such errors are found, more Fix records may be added to correct the defective bits.

Finally, ECC may be generated and/or used by means of a serial shift technique.

BRIEF DESCRIPTION OF THE DRAWINGS

The invention will now be described in connection with the attached drawings, in which:

FIG. 11 is a diagram of serial error correction logic, according to an embodiment of the invention;

FIGS. 12a and 12b are detailed diagrams of the logic that may be used in some embodiments of the logic shown in FIG. 11;

DESCRIPTION OF VARIOUS EMBODIMENTS

Embodiments of the present invention are now described with reference to diagrams in FIGS. 2 through 12b and 17, it being appreciated that the diagrams illustrate the subject matter and may not be to scale or to measure, and flowcharts in FIGS. 13 through 16b, it also being appreciated the that flowcharts illustrate the subject matter and may not be to the same level of detail or organization.

Memory Organization

NV memories may contain blocks of memory, where each block may contain multiple pages. While in some NV memories, individual words may externally appear to be read or written, internally, an entire page may be read or written; and if rewritten, the original page may be marked for deletion, and a new, modified page may be written elsewhere in the memory. To reuse a deleted page, the entire block in which the page resides may generally need to be erased.

Figure 1:
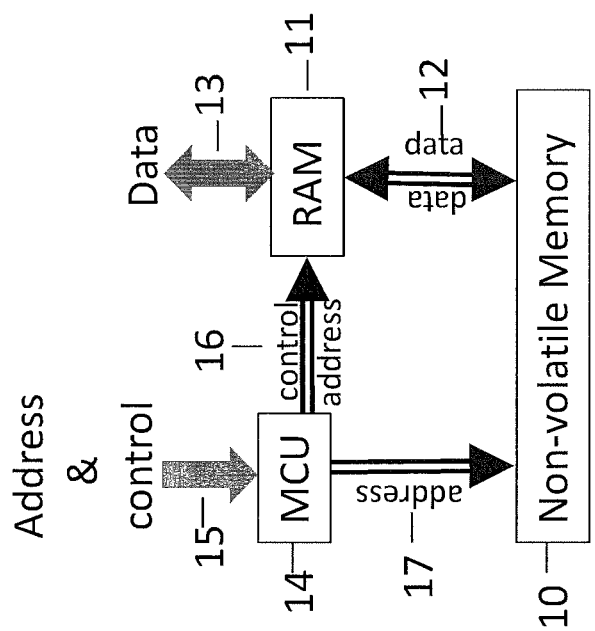
FIG. 1 is a system diagram of a non-volatile memory with a processor and memory.
Figure 2:
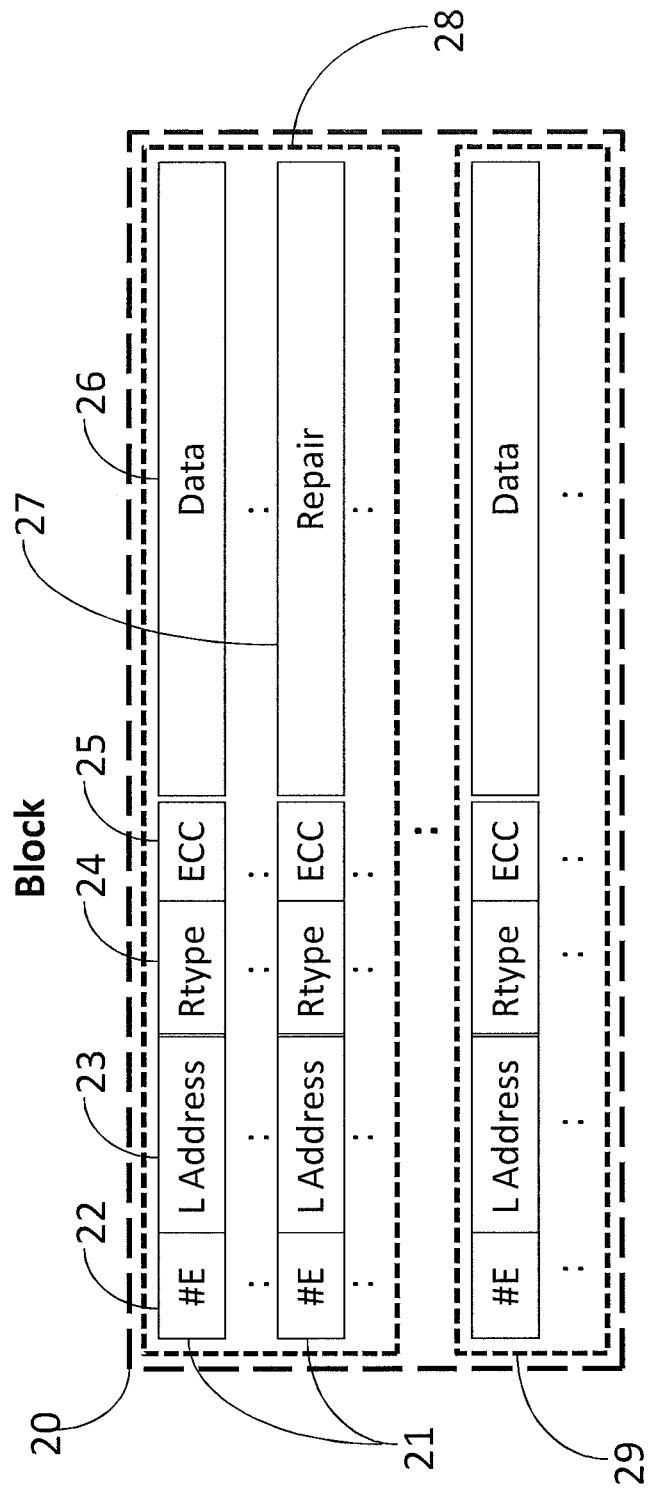
FIG. 2 is a simplified diagram of a block, page and record structure of an NV memory, according to an embodiment of the invention.

As such, reference is now made to FIG. 2, a simplified diagram of block, page and record structure of a non-volatile memory according to an embodiment of the invention. Each block 20 may contain a number of pages 28,29, each of which may contain a number of records 21. Each record may contain header information that may include an error count 22, a logical address 23, a record type 24, and the header ECC 25. Each record may contains either data 26 for a Data record or repair 27 for a Fix record. Each page may contain a plurality of Data records and, in one embodiment, at least one Fix record. The record types (Rtypes) may include at least: Erased (New), Deleted (Bad), Fix, and Data. The record types may be coded such that transitions from Erased through Fix and Data to Deleted may be done with successive writes. Also Used (Fix and Data) record types may be distinguished from Unused (Deleted and Erased) record types, and the Erased code may be composed of erased bits. One such four-bit code may be seen in Table 1 below:

TABLE 1

| Rtype | Code |
| --- | --- |
| Deleted | 1000 |
| Erased | 1111 |
| Data | 1101 |
| Fix | 1100 |
| [Used] | 110x |

Typically, flash memories may have a range of page and block sizes, with, e.g., between 32 and 128 pages per block. Using this structure, one or more Data records with the same logical address may form a page 29, and one or more Data records with one or more Fix records may form a page 28, but in all cases, all records contained in a page may have the same logical address. The size of a block may be hardwired into the NV memory, but page size and corresponding number of pages per block may be set when the memory is formatted.

An embodiment of the present invention may include a non-volatile (NV) memory augmented with a serial content addressable memory (CAM) containing comparison logic for each record to detect one or more matches of logical addresses and minimum logic to find the least used available records.

Figure 3:
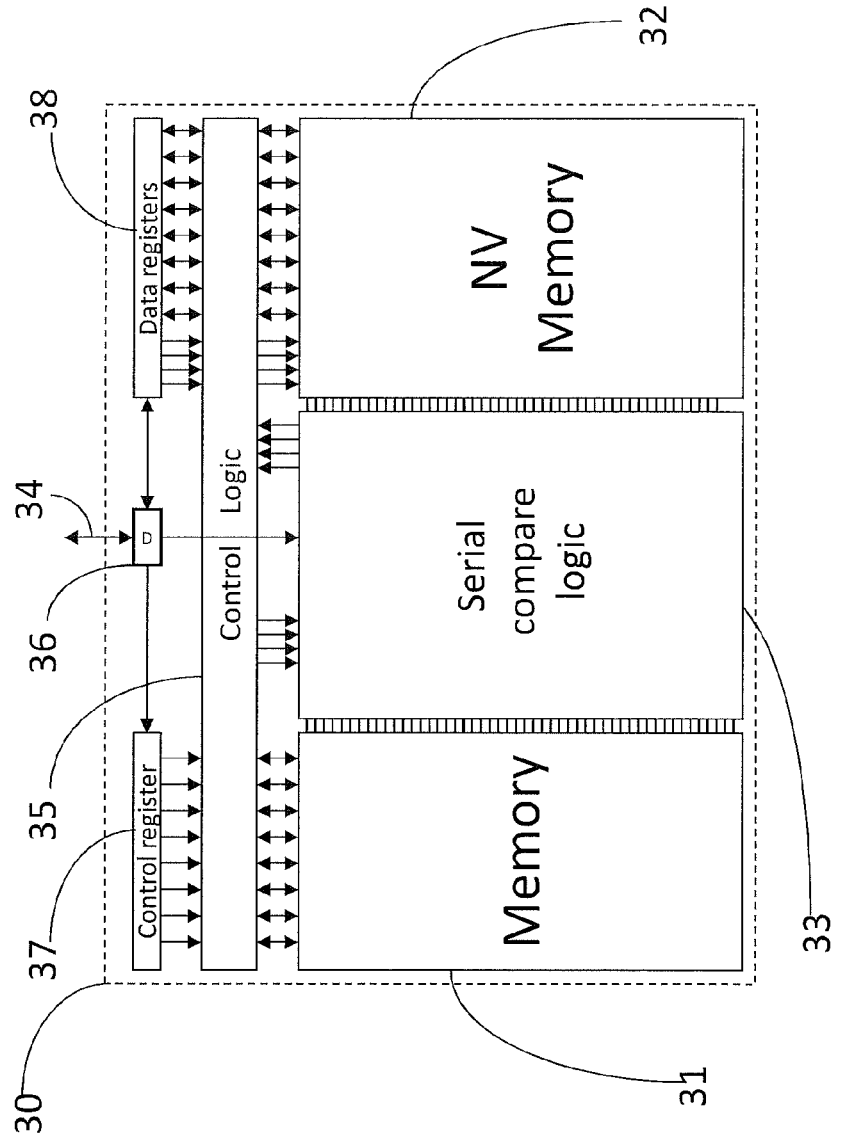
FIG. 3 is a system diagram of an NV memory with a serial CAM, according to an embodiment of the invention.

Reference is now made to FIG. 3, a diagram of an embodiment of a non-volatile memory system 30 with serial CAM logic. Unlike a traditional CAM, the serial CAM employs a memory section 31 for serial CAM functions. The NV memory system 30 also includes a section of NV memory 32 for the normal page data. The memory section 31 may be NV memory, in which case it may be similar to the NV memory section 32, or a larger, faster, more reliable version of NV memory. The memory section 31 may also be a faster volatile memory, in which case the volatile memory may be initialized from a separate NV memory on power up, and its contents may be saved in the NV memory upon power down. While these are shown as two sections of memory 31, and 32, they may also be combined as one NV memory. The serial compare logic 33 may include functions for performing the logical address lookup, finding the minimum error count records for wear level writing, and minimizing the relocation of used pages when erasing partially used blocks. A block of control logic 35 may translate external requests, serially entered via one or more staging registers 36, into a set of control registers 37. The data to be written may also be shifted from the staging register(s) 36 into a set of data registers 38. On a read, the resulting data may be shifted from the data registers 38 through one or more staging registers 36 to the external host. The address portion of the operations may be serially loaded into the serial compare logic 33 from the external interface 34, which may be a serial or parallel interface.

Figure 4:
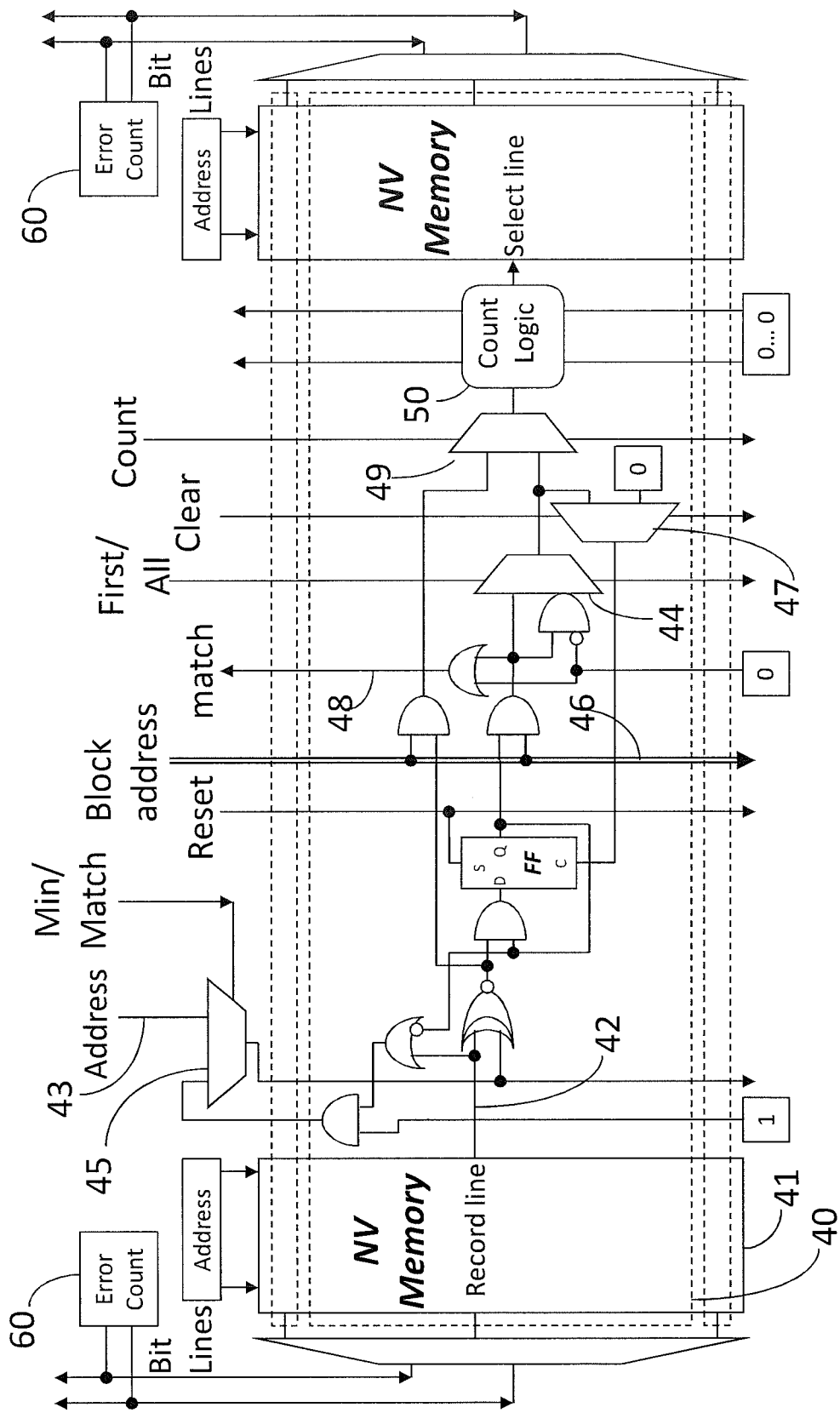
FIG. 4 is a diagram of one bit of the serial CAM logic of FIG. 3, according to an embodiment of the invention.

Reference is now made to FIG. 4, a diagram of an embodiment of one bit slice 40 of the serial compare logic 33, along with a portion of the control logic 35, as shown in FIG. 3.

The NV memory 41 may contain the header information for each record such that the bit line 42 for each record may be serially compared to a serially inserted logical address 43, thus selecting with a multiplexor 44 either the first or all matching logical records.

In another embodiment, to write a page in a modified "wear leveling" manner, by successively selecting the bits in the error count, from the most significant bit (MSB) to the least significant bit (LSB), the multiplexor 45 may be used to find and select the Erased records with the fewest errors.

Also, if insufficient Erased records exist to write the page, a block of records may be erased. The selection of the next block to erase may be a minimum function of the number of errors in the block and the number of Used records in the block.

In another embodiment, the number of Used records may be determined for each block by selecting the Used records, selecting the block 46, selecting the first match through multiplexor 44, and using the clear multiplexor 47 on successive clock cycles to clear each match while incrementing a counter (not shown) until the match line 48 transitions low. The counter then may then contain the count of the Used records for that block.

In yet another embodiment, slices of count logic 50 may be employed to speed up the process. After selecting the records with the fewest writes, the number of Used records may be determined for each block by selecting the Used records and incrementing through the block addresses 46 using the slices of count logic 50 to obtain the Used record count from which the block with the fewest number of Used records may be chosen. The block address lines 46 may be either all 1s when not addressing a block or either the positive or negative decode of the block address when used.

Figure 5:
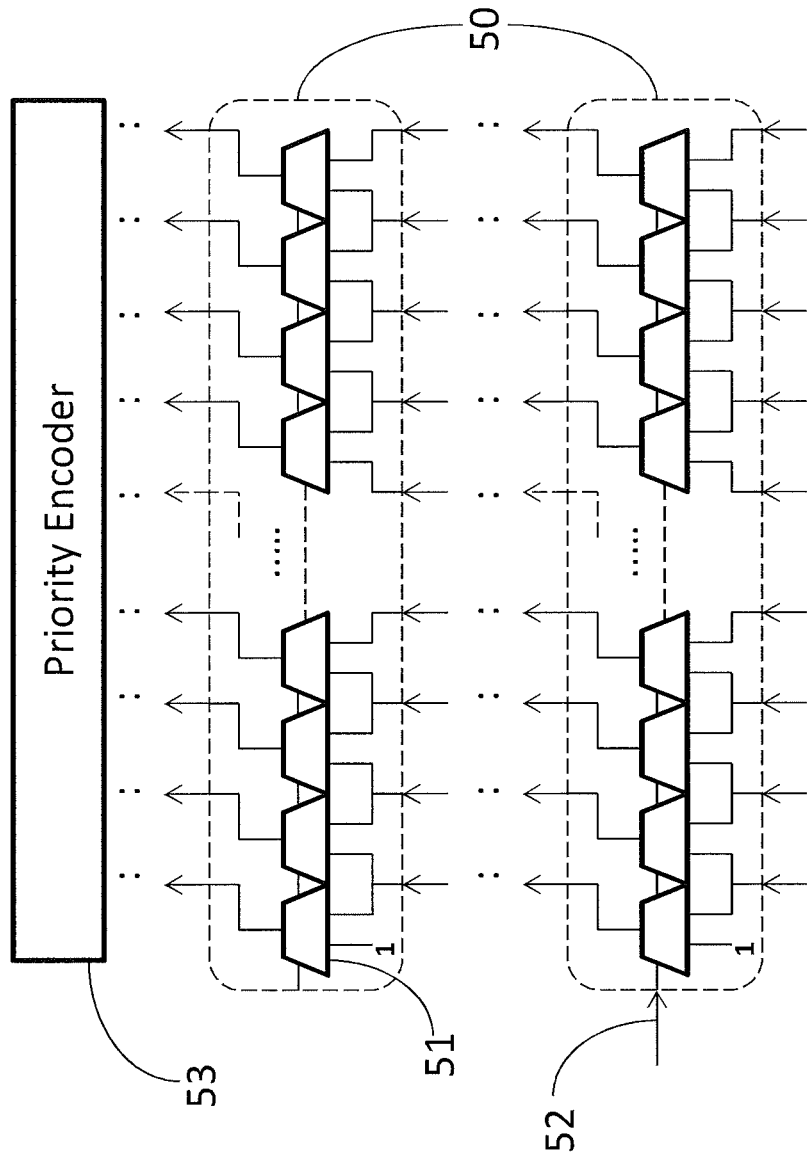
FIG. 5 is a diagram of count logic, according to an embodiment of the invention.

Reference is now made to FIG. 5, a diagram of multiple slices 50 of the count logic shown in FIG. 4. Each slice may consist of a plurality of multiplexors 51 that, when the select line 52 is active, shift an existing set of 1s to the right and add an additional 1. In this manner, the number of active select lines may be determined by the count from a priority encoder 53 after the last count logic slice. The priority encoder 53 may reside in the control logic 35 shown in FIG. 3. Typically, the number of multiplexors 51 in a given slice 50 may at least be equal to the number of records in a block.

The number of errors contained within a block is equivalent to the sum of the errors residing in each of the records within the block. This may be determined by clearing a block count register in the control logic (35 in FIG. 3), selecting all the records in a block (20 in FIG. 2), reading each record into the control logic 35, and adding each record's error count (22 in FIG. 2) to the block count.

In another embodiment, the error count logic 50 may be used to determine a block's error count. More specifically, this may be done by: a) clearing a block count register in the control logic; b) selecting a block (46 in FIG. 4); selecting the record data through a count multiplexor (49 in FIG. 4); and c) successively selecting each bit in the error count (22 in FIG. 2) in the NV memory (41 in FIG. 4) from the MSB to the LSB, and for each bit, adding the output from the priority encoder (53 in FIG. 5) to double the contents of the block count register.

Figure 14:
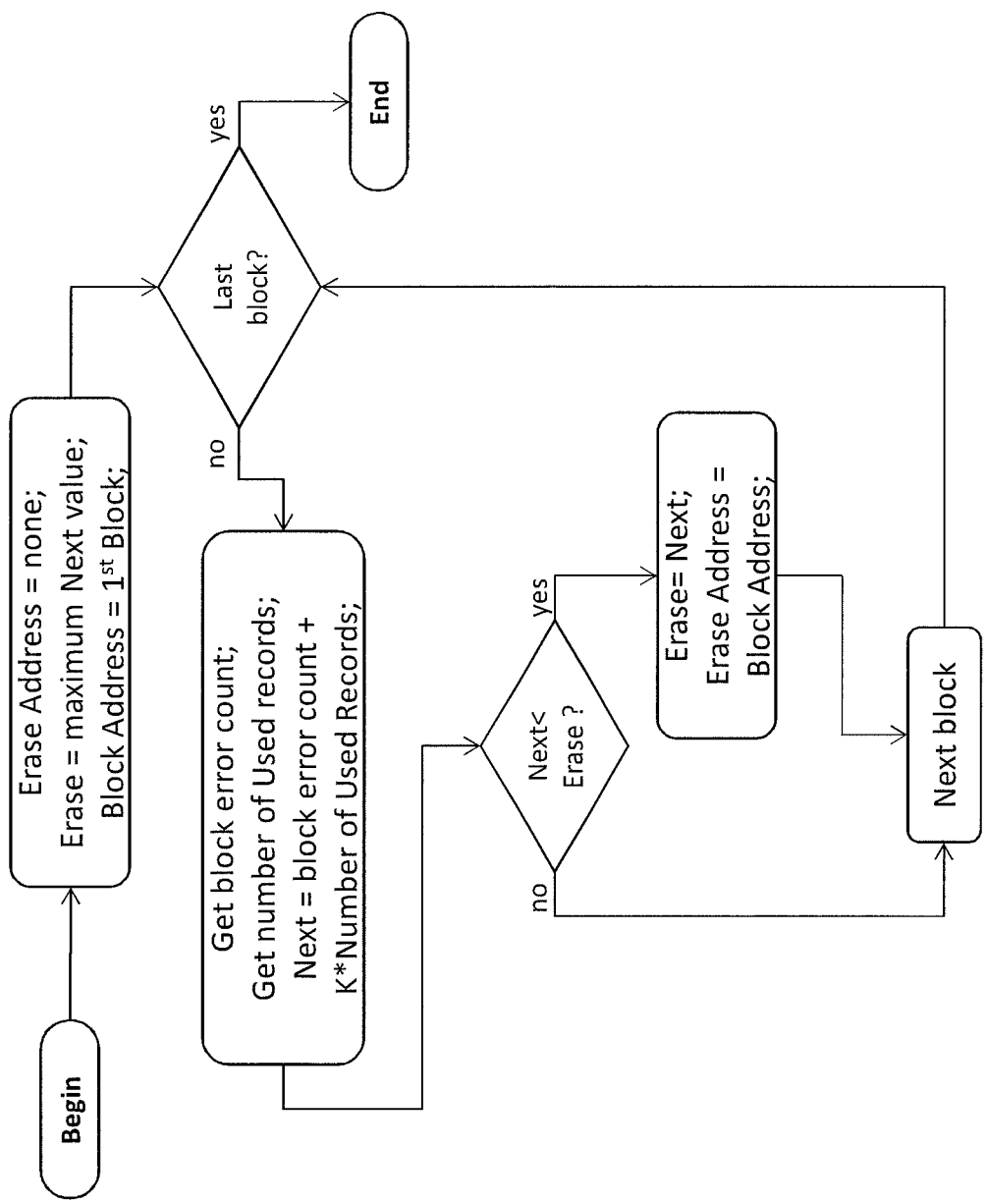
FIG. 14 is a flowchart of a procedure to select the next block to erase.
Figure 15:
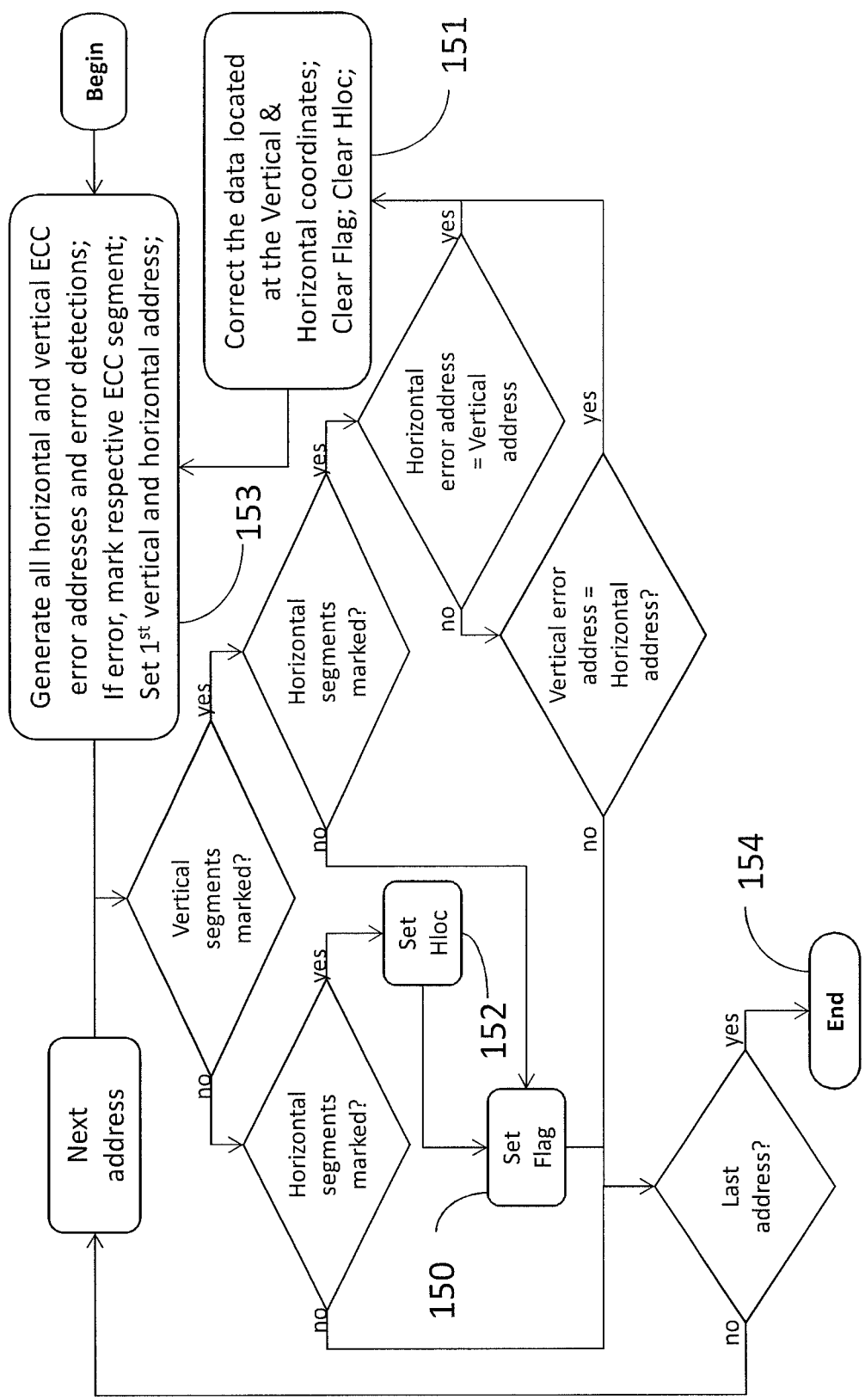
FIG. 15 is a flowchart of a procedure to correct errors in Data records.

In another embodiment, the process of selecting the next block to erase may be to find the block with the fewest combination of errors and Used records, by performing the process according to the flowchart in FIG. 14, after which the Used records within the selected block may be read, corrected and written to other records.

The selected block may be erased, each of the erased records may be read, their errors, the bits that failed to erase, may be counted, and the results, for each record, may be written back into the record's error count (22 in FIG. 2). Optionally, this process may be repeated until the sum of all the record's error counts has not changed.

Figure 6:
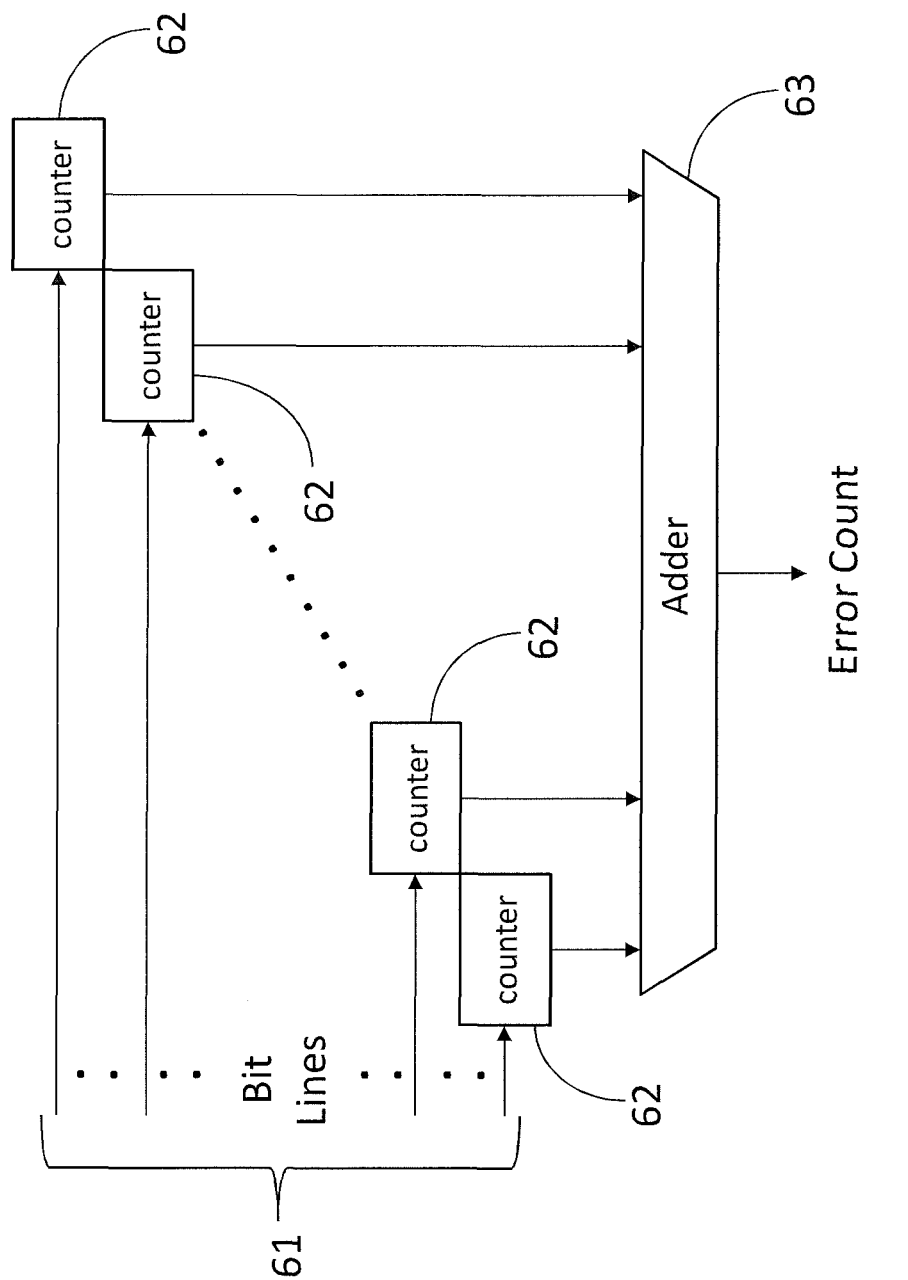
FIG. 6 is a simplified diagram of error count logic, according to an embodiment of the invention.

In another embodiment, the Error Count Logic (60 in FIG. 4) may be employed to speed up the process of erase error counting. Reference is now made to FIG. 6, a simplified diagram of the Error Count Logic. The count of the erase errors may be performed as the erased records are being read from the NV memory. The zeros or errors on the bits lines 61 may be used to increment counters 62, whose outputs may be summed with an adder 63, producing an error count. The error count may be written back into the error count field (22 in FIG. 2). In order to minimize the perturbation of the bits in the error count, the count may be inverted starting with all 1s.

Error Correction Organization

Again referring to FIG. 2, each record 21 contains a header ECC 25, which may support at least single-bit error correction, or may support multi-bit error correction, of all or slices of the record's header information.

In one embodiment of the present invention, the number of Data records per page may be used to check the correctness of the Data records' headers.

Whenever a Used logical address is selected, if the number of Data records is greater than the number of records in a page, then one may presume that one or more Data records incorrectly has this used logical address. In this case each Data record's header may be corrected with its header ECC, and if the Data record's logical address was corrected, the Data record may be deleted and rewritten into a new record. This procedure may be called a "corrected read".

On the other hand, if the number of Data records is less than the number of records in a page, one or more of the Used logical addresses' Data records may have single bit errors in their logical addresses. In this case, the missing Data records may be found by selecting and counting the Data records for all logical addresses that differ from the specified logical address by a single bit. A "corrected read" may then be performed on all the Data records of those logical address(es) that contain extra Data records, thereby retrieving the "lost" data record(s). For example, given a four bit logical address of 5 [0101], one may start by inverting the lowest order bit, yielding an address of 4 [0100]. If there is an extra data record after selecting and counting the data records of logical address 4, a "corrected read" may be applied to all the data records of logical address 4. This process may continue with address 7 [0111], address 1 [0001] and address 13 [1101], by inverting the second, third and highest order bit of the initial logical address 5, or until all the "lost" data record(s) have been found. Note that the same result may be obtained by starting with any bit, providing that all bits are eventually inverted, as is shown in the flowchart depicted in FIG. 13.

Figure 7:
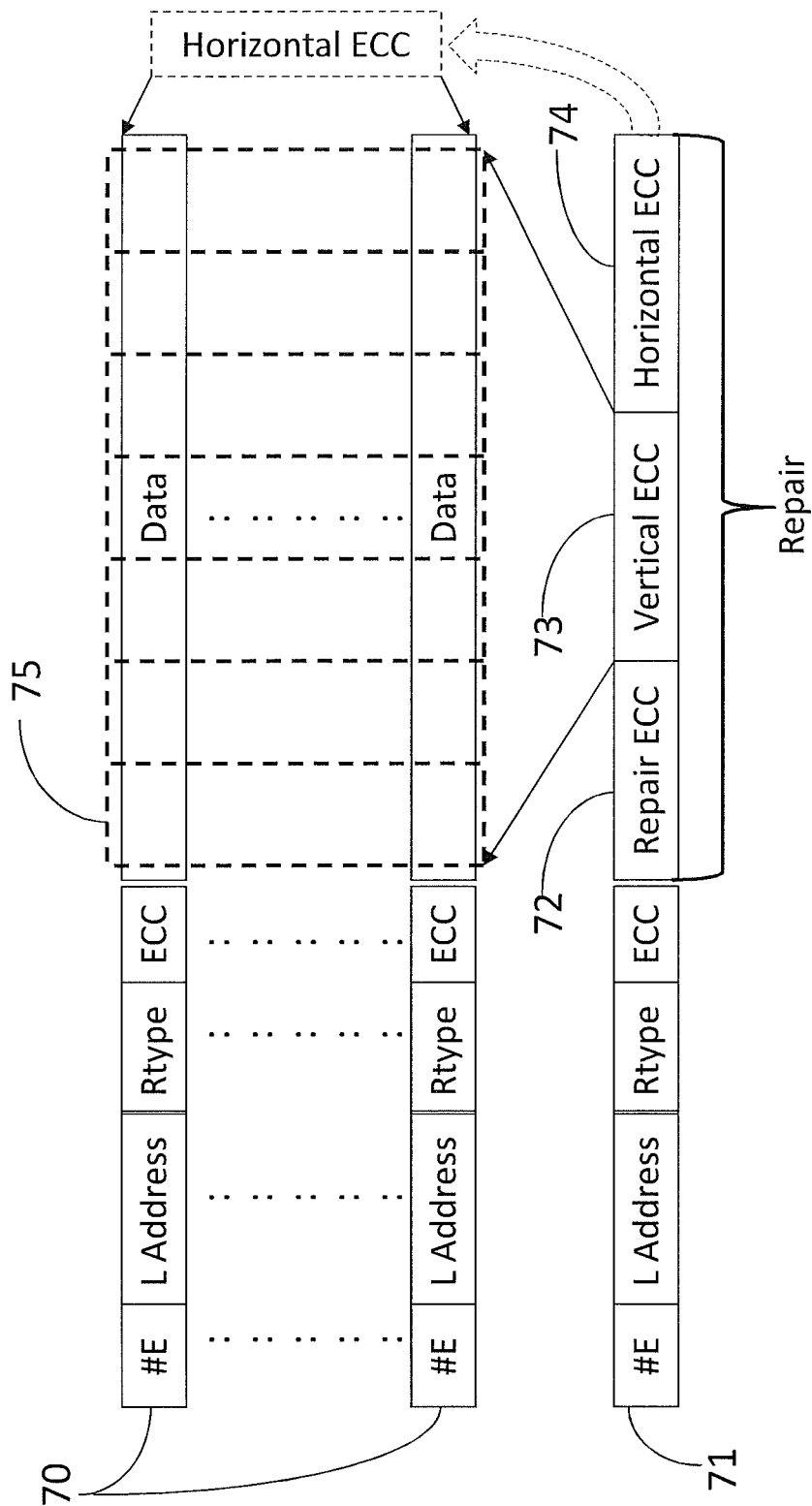
FIG. 7 is a diagram of a page and record structure with Repair details, according to an embodiment of the invention.

Reference is now made to FIG. 7, a simplified diagram of the page and record structure of the NV memory with Repair details, according to an embodiment of the invention. All pages may contain a plurality of Data records 70 and at least one Fix record 71. Each Fix record may contain Repair information that may include Repair ECC 72, Vertical ECC 73 and Horizontal ECC 74. The Repair ECC may be used to correct the Repair information in the Fix Record. The Vertical ECC 73 may contain multiple ECC segments, each of which may check and correct a vertical slice 75 of a portion of or all of the data contained in the page's Data records 70. The Horizontal ECC may contain multiple ECC segments, each of which may check and correct a portion of or all of the data contained in each of the page's data records 70. The Horizontal ECC and Vertical ECC may also check and correct themselves, and they may perform single- or multiple-bit error detection and/or correction.

In another embodiment, if the need exists for greater error correction of the Data records additional Fix records may be generated.

Figure 8:
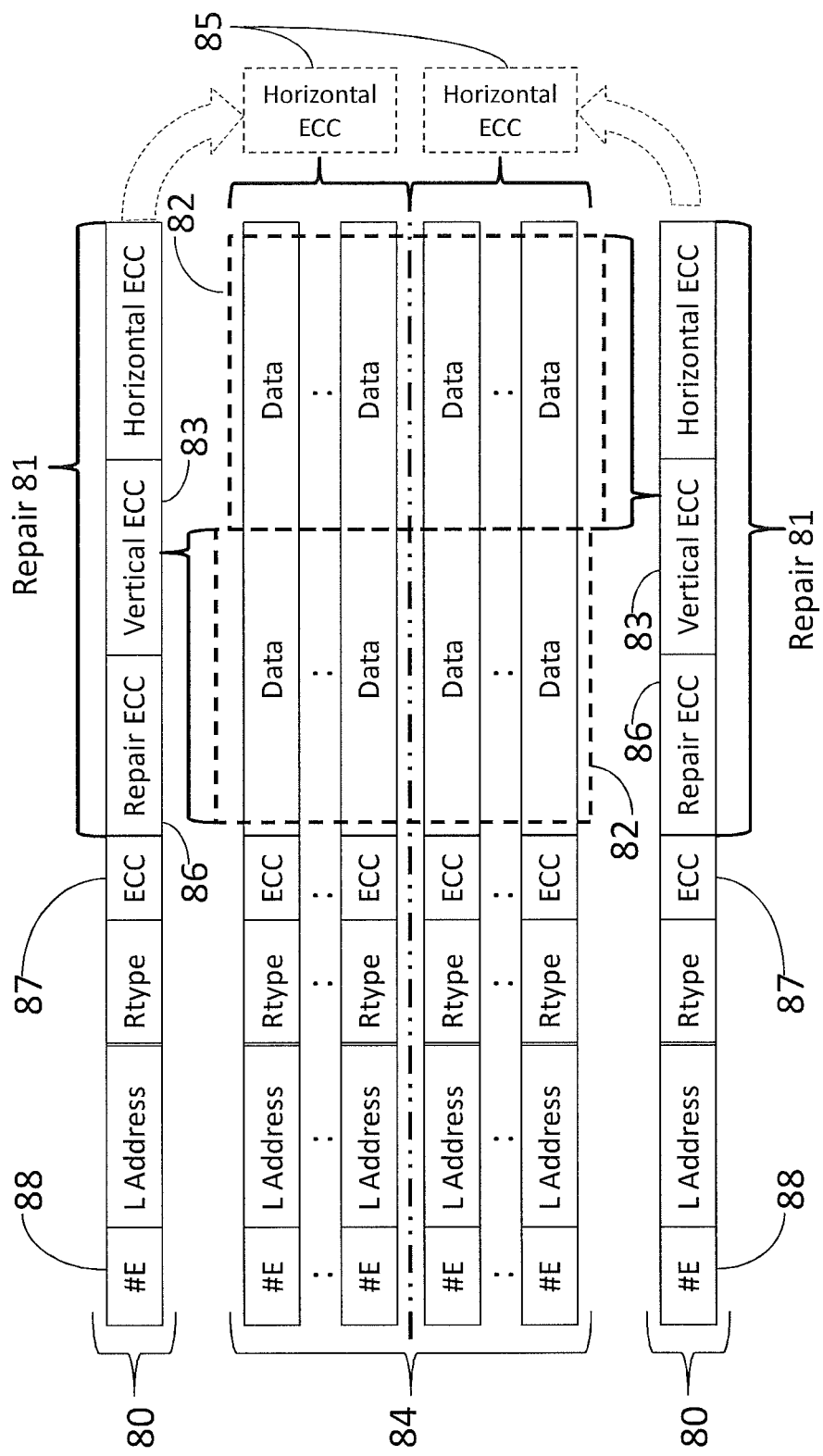
FIG. 8 is a diagram of a page and record structure with multiple Fix records, according to an embodiment of the invention.

Reference is now made to FIG. 8, a diagram of a page and record structure with multiple Fix records. If the need exists for greater error correction of a page's Data records, multiple Fix records 80 with Repair information 81 may be generated. The vertical slices 82 of data may be split between the Vertical ECC sections 83, and the Data records' 84 data may be split among Horizontal ECC sections 85, which may be in the physical order of the Fix records. As the number of Fix records increases, the number of Vertical ECC and Horizontal ECC segments per Fix record may change such that each ECC segment either covers less data, or has more bit correction for the data covered. In any case, the number and type of ECC segments per Fix record may generally be dependent only on the number of Fix records.

ECC Generation and Error Correction

Figure 9:
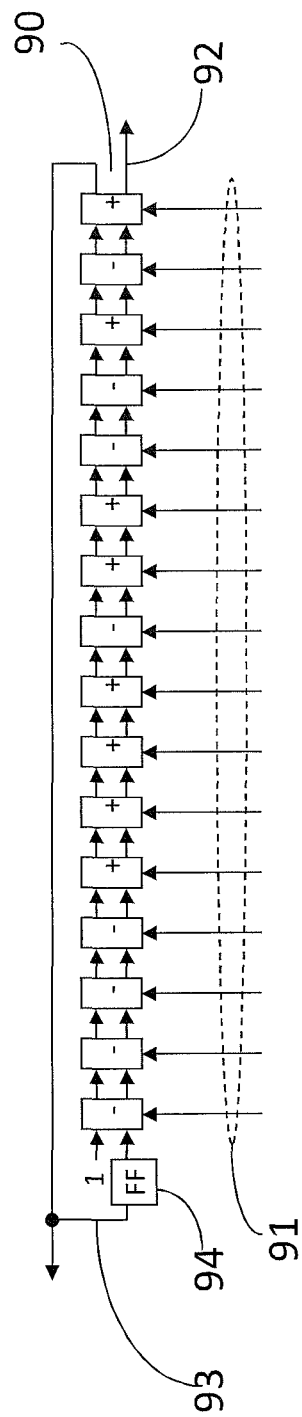
FIG. 9 is a diagram of a serial ECC generator, according to an embodiment of the invention.

In another embodiment, the ECC may be serially generated using a shift register (SR). Reference is now made to FIG. 9, a diagram of a serial ECC generator using a SR 90. The SR has $2^N$ bits, half of which may be of a + type and the other half of which may be of a − type, represented, respectively, in FIGS. 10a and 10b. The selection of which bit is + and which is − may be determined by an algorithm presented previously by the inventor in U.S. Pat. No. 7,421,563, the contents of which are incorporated herein by reference. The $2^N$ data bits may be entered into inputs 91 such that the SR may generate a full checksum clocked into the flip-flop 94 via feedback 93. Thereafter the inputs 91 may be set to 1s, and the SR 90 with the flip-flop 94 may be clocked N times to shift in the N ECC bits via the feedback 93 while the first N+1 data bits may be shifted out the output 92. The resulting serial stream contains $2^N+N+1$ bits, beginning with the $2^N$ bits of data and followed by the checksum and N ECC bits.

Figure 10B:
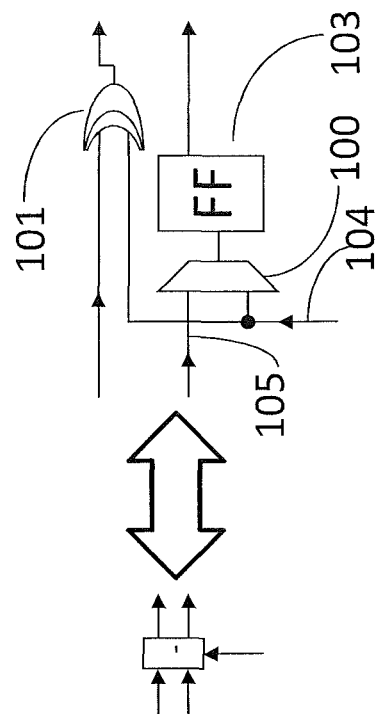
FIGS. 10a and 10b are detailed diagrams of the logic in FIG. 9, according to an embodiment of the invention.
Figure 10A:
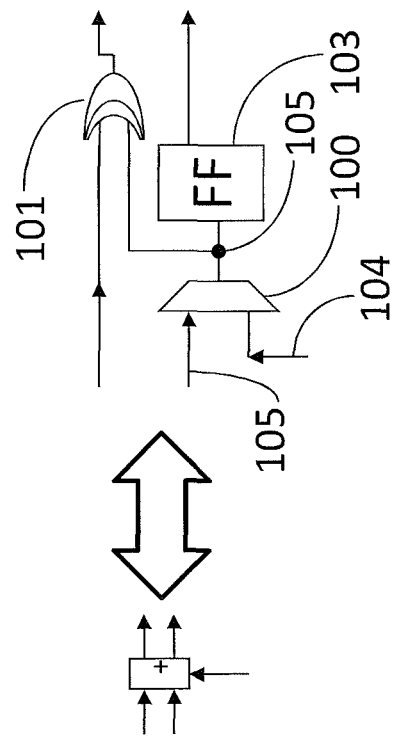
Figure 13:
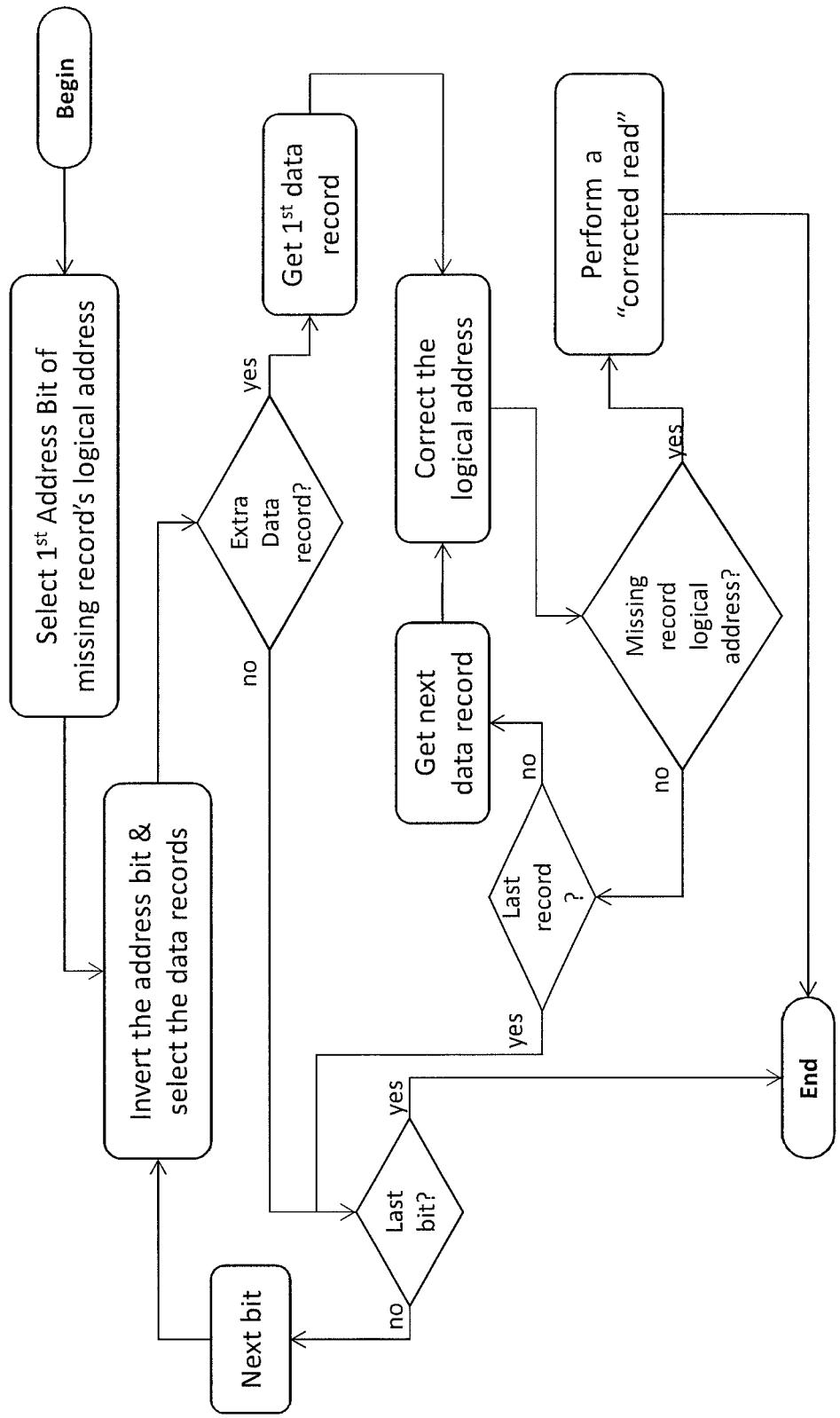
FIG. 13 is a flowchart of a procedure to retrieve and correct a missing record with an incorrect logical address.

Reference is now made to FIGS. 10a and 10b, detailed diagrams of embodiments of the logic in FIG. 9. The $2^N$ data bits may be clocked into the SR's register bits 103 by selecting the inputs 104 through the bit multiplexors 100. Alternatively, the SR may be shifted by selecting the shift inputs 105 through the multiplexors 100 and clocking the register bits 103. Half of the register bits' inputs connect directly to the XOR 101, which when set high disables the XOR 101 function for proper ECC generation. The other half of the register bits' multiplexor output 105 connects to the XOR such that a checksum may be generated when the multiplexor 100 selects the inputs 104.

In another embodiment, $2^N$ bits of data may be corrected by inputting N bits of corrected ECC data into a Circular Shift Register (CSR). Reference is now made to FIG. 11, a diagram of an example of serial error-correction logic. The CSR 110 has $2^N$ bits, half of which may be of a + type and the other half of which may be of a − type, represented, respectively, in FIGS. 12a and 12b. Again, the selection of which bit is + and which is − may be determined by an algorithm presented previously by the inventor in U.S. Pat. No. 7,421,563. Initially all bits in the CSR may be set to 1s, by setting both the IN input 113 and the Set input 114 to 1s. For each of N clock cycles, a bit of "address" data may be serially applied to the IN input 113, resulting in a single bit in the CSR, corresponding to inputted "address", being set to 1.

Figure 17:
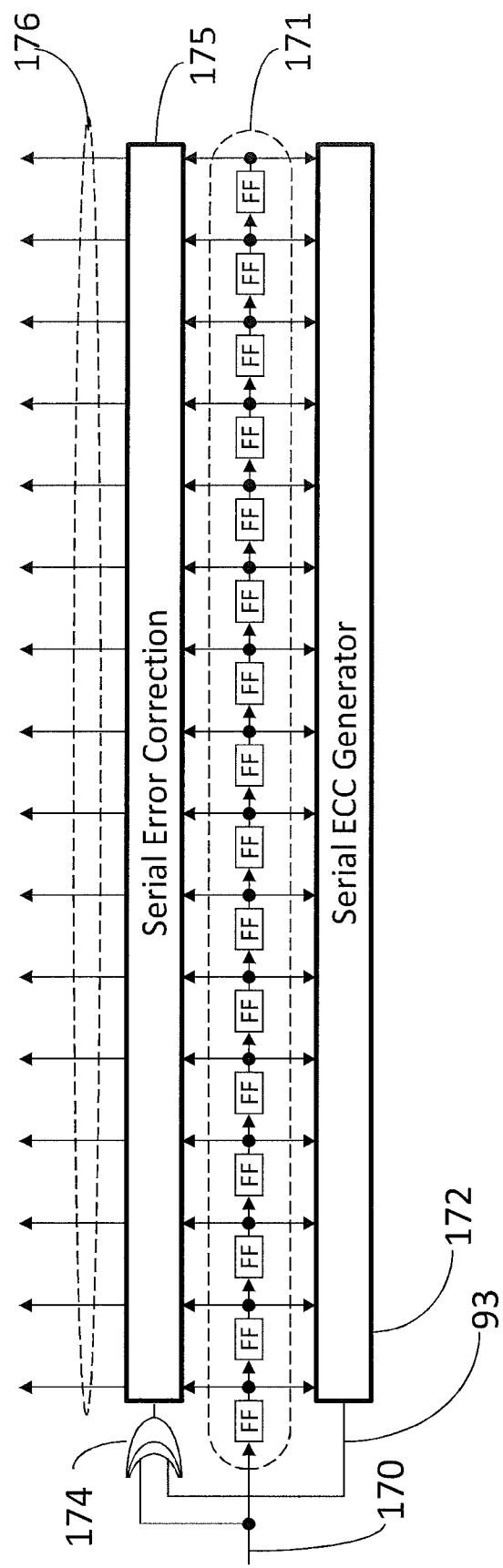
FIG. 17 is a diagram of an example of serial ECC correction logic using the serial error correction logic depicted in FIG. 11 and the serial ECC generator depicted in FIG. 9.

Reference is now made to FIG. 17, a diagram of serial ECC correction logic using the serial error correction logic depicted in FIG. 11 and the serial ECC generator depicted in FIG. 9. Initially the $2^N$ data bits may be serially shifted into a shift register 171. The serial ECC generator 172 may then generate checksum bits outputted through the feedback output 93. The generated checksum may be exclusive-ORed 174 with the original checksum on the input 170. The result may be used in conjunction with a Set signal (114 in FIG. 11) to set the bits in the serial error correction logic 175 to 1s if the original checksum is different from the generated checksum. In this manner, the serial error correction logic 175 may be initialized for error correction. In a similar fashion, the next N bits of original ECC data may be exclusive-ORed with generated ECC data from the serial ECC generator 172, which may be used to "address" a single bit in the serial error correction logic 175, which may then be used to output the corrected data from the shift register 171 onto the outputs 176 of the serial error correction logic 175. In this fashion, ECC may be rapidly generated for large blocks of data, and the data may be rapidly corrected, with a minimal amount of logic.

It should be understood that such SR and CSR structures may be any power of 2 in size, where N (i.e., the power of 2) may be any integer. It is further contemplated that such CSR structures may be used for transmitting and receiving serial data externally out of and into the NV memory system, or other devices, for example, but not limited to, integrated circuits, thereby providing error correcting capability during the transfer of data to and from the system. In another embodiment, a logical address may be concatenated with a record address such that each record has a unique address. In this case, the order of the record addresses may be used to determine which Fix records apply to which section of a page's data.

Error Correction Processes

In another embodiment, upon reading a page of records, errors may be corrected by iteratively using the Vertical and Horizontal ECC segments to correct all the correctable portions of data. For this discussion, a "portion" of data is the amount of data that is common between a horizontal ECC segment and a vertical ECC segment. Often it is either a bit or a byte, in that each ECC segment detects and/or corrects bits or bytes of the data, but the ECC segments may address other sizes of data. The original ECC segment may be exclusive-ORed with ECC segment using defective data, the generated results of which may then address portions of data to be corrected, or may indicate that an error exists in the data. Single- or multi-bit error correcting ECC with a checksum may reliably detect an error in at least one more portion of data than it may address to correct. Unfortunately, when more errors exist in the slice of data than may be corrected or detected by the ECC, the results of error correction and/or detection may be unreliable. Excessive errors may cause the ECC to either address the wrong data or fail to detect an error. As shown in FIG. 8, if Fix records exist, the records' ECC segments may cover horizontal and/or vertical slices of the data from the corresponding Data records, effectively addressing the data from two dimensions. This redundancy may allow the iterative fixing of multiple vertical and horizontal errors by applying the heuristic process depicted in the flowchart in FIG. 15 called "Page Error Correction".

In this process, each portion of data is examined, and if both the horizontal and vertical ECC segments are marked, and if either ECC error address matches the opposite coordinate of the portion of data being examined, then the portion may be corrected, and the error addresses and error detections may be regenerated. The "Page Error Correction" process may continue until all portions of data have been examined without correction.

To better illustrate this process, Table 2 contains an example, to which the invention is not limited, of a defective page of 8 data records, each with 8 portions of data in each record. The example has 8 horizontal ECC segments and 8 vertical ECC segments, one for each column and row of the two dimensional matrix of data portions, each with double error detection and single error correction. Table 2 below contains the 8 by 8 matrix of data errors marked with Xs, the ECC segments error detection marked as Ys, with the ECC error addresses shown in the bottom and right-most columns.

TABLE 2

| x | 0 | 1 | 2 | 3 | 4 | 5 | 6 | 7 | Err | Adr |
|---|---|---|---|---|---|---|---|---|---|---|
| 0 |   |   |   | X |   |   |   |   |   | 3 |
| 1 |   |   |   | X |   |   |   |   |   | 3 |
| 2 |   |   | X |   |   |   |   |   |   | 2 |
| 3 |   |   | X |   | X | X |   |   |   | 0 |
| 4 |   |   |   | X | X |   |   |   | Y |   |
| 5 |   |   |   | X |   |   |   |   |   | 3 |
| 6 |   |   |   |   | X |   |   |   |   | 4 |
| 7 |   |   |   |   |   |   |   |   |   |   |
| Err |   |   | Y | Y |   |   |   |   |   |   |
| Adr |   |   |   | 1 |   | 3 |   |   |   |   |

The "Page Error Correction" may proceed from the address of a first portion [0,0] until portion [3,0] without changes. At portion [3,0], both the Horizontal and Vertical ECC segments show an error, and the Horizontal ECC segment [0] shows an error address equal to the Vertical address [3], thereby branching to block 151 (of FIG. 15) such that the portion of data may be corrected and the ECC segments in block 153 (of FIG. 15) may be regenerated, resulting in the state shown in Table 3 below:

TABLE 3

| x | 0 | 1 | 2 | 3 | 4 | 5 | 6 | 7 | Err | Adr |
|---|---|---|---|---|---|---|---|---|---|---|
| 0 |   |   |   | o |   |   |   |   |   |   |
| 1 |   |   |   | X |   |   |   |   |   | 3 |
| 2 |   |   | X |   |   |   |   |   |   | 2 |
| 3 |   |   | X |   | X | X |   |   |   | 0 |
| 4 |   |   |   | X | X |   |   |   | Y |   |
| 5 |   |   |   | X |   |   |   |   |   | 3 |
| 6 |   |   |   |   | X |   |   |   |   | 4 |
| 7 |   |   |   |   |   |   |   |   |   |   |
| Err |   |   | Y |   |   |   |   |   |   |   |
| Adr |   |   | 0 | 1 |   | 3 |   |   |   |   |

The "O" marks the location [3,0] of the previous error. By regenerating the error addresses and error detection, the error address in the Horizontal ECC segment[0] may be cleared, and the Vertical ECC segment[3] may be changed to an erroneous error address 0. The process may continue correcting the portion of data at [3,1] because the Horizontal ECC segment[1] has a correct error address [3], and [2,2] because the Horizontal ECC segment[2] has a correct error address [2], as shown in Table 4 below:

TABLE 4

| x | 0 | 1 | 2 | 3 | 4 | 5 | 6 | 7 | Err | Adr |
|---|---|---|---|---|---|---|---|---|---|---|
| 0 |   |   |   |   |   |   |   |   |   |   |
| 1 |   |   |   | O |   |   |   |   |   |   |
| 2 |   |   | O |   |   |   |   |   |   |   |
| 3 |   |   | X |   | X | X |   |   |   | 0 |
| 4 |   |   |   | X | X |   |   |   | Y |   |
| 5 |   |   |   | X |   |   |   |   |   | 3 |
| 6 |   |   |   |   | X |   |   |   |   | 4 |
| 7 |   |   |   |   |   |   |   |   |   |   |
| Err |   |   |   | Y |   |   |   |   |   |   |
| Adr |   |   |   | 3 |   | 1 |   | 3 |   |   |

The Vertical ECC segment [2] may then have an error address [3] causing the portion of data at [2,3] to be corrected. The next error at [4,3] may not be corrected because neither the Horizontal ECC segment[3] error address nor the Vertical ECC segment[4] error address, which are shown as [0] and [1] respectively, match [4] and [3], the address of the portion of data. Thereafter, the [6,3] portion of data may be corrected because the Vertical ECC segment [6] has an error address [3] which matches the horizontal address of the portion being corrected, as can be seen in Table 5 below:

TABLE 5

| x | 0 | 1 | 2 | 3 | 4 | 5 | 6 | 7 | Err | Adr |
|---|---|---|---|---|---|---|---|---|---|---|
| 0 |   |   |   |   |   |   |   |   |   |   |
| 1 |   |   |   |   |   |   |   |   |   |   |
| 2 |   |   |   |   |   |   |   |   |   |   |
| 3 |   |   |   | O |   | X |   | O |   | 4 |
| 4 |   |   |   | X | X |   |   |   | Y |   |
| 5 |   |   |   | X |   |   |   |   |   | 3 |
| 6 |   |   |   |   | X |   |   |   |   | 4 |
| 7 |   |   |   |   |   |   |   |   |   |   |
| Err |   |   |   | Y |   |   |   |   |   |   |
| Adr |   |   |   |   |   | 1 |   |   |   |   |

Next [4,3], may be corrected, clearing the Horizontal ECC segment [3] error, and then [3,4] and [4,4] may be skipped over because neither of the Horizontal and Vertical directions have correct error addresses. The portion of data at [3,5] may then be corrected because the Horizontal ECC segment [5] has the correct error address [3]. Regenerating the error addresses may result in TABLE 6 below:

TABLE 6

| x | 0 | 1 | 2 | 3 | 4 | 5 | 6 | 7 | Err | Adr |
|---|---|---|---|---|---|---|---|---|---|---|
| 0 |   |   |   |   |   |   |   |   |   |   |
| 1 |   |   |   |   |   |   |   |   |   |   |
| 2 |   |   |   |   |   |   |   |   |   |   |
| 3 |   |   |   | O |   |   |   |   |   |   |
| 4 |   |   |   | X | X |   |   |   | Y |   |
| 5 |   |   |   | O |   |   |   |   |   |   |
| 6 |   |   |   |   | X |   |   |   |   | 4 |
| 7 |   |   |   |   |   |   |   |   |   |   |
| Err |   |   |   | Y |   |   |   |   |   |   |
| Adr |   |   |   | 4 |   |   |   |   |   |   |

Finally, as a result of the regenerated, corrected error addresses, the portion at [3,4] may be corrected because the Vertical ECC segment [3] error address is [4], and the last two errors may be similarly corrected because their Horizontal error addresses are correct.

It should be noted that unlike the example shown above, some combinations of four or more portions with errors in the vertical or horizontal direction may be hidden from both detection and correction, as shown in Table 7 below:

TABLE 7

| x   | 0 | 1 | 2 | 3 | 4 | 5 | 6 | 7 | Err | Adr |
|-----|---|---|---|---|---|---|---|---|-----|-----|
| 0   |   |   |   |   |   |   |   |   |     |     |
| 1   |   |   |   | X |   |   |   |   |     | 3   |
| 2   |   |   |   | X |   |   |   |   |     | 3   |
| 3   |   |   | X |   |   |   |   |   |     | 2   |
| 4   |   |   | X |   | X |   | X |   |     | 0   |
| 5   |   |   |   | X | X |   |   |   | Y   |     |
| 6   |   |   |   | X |   |   |   |   |     | 3   |
| 7   |   |   |   |   | X |   |   |   |     | 4   |
| Err |   | Y |   |   |   |   |   |   |     |     |
| Adr |   |   |   |   |   | 6 | 4 |   |     |     |

In this case the errors in Vertical Segment[3] may be masked, which may result in the culmination of the "Page Error Correction" procedure with the state shown in Table 8 below:

TABLE 8

| x   | 0 | 1 | 2 | 3 | 4 | 5 | 6 | 7 | Err | Adr |
|-----|---|---|---|---|---|---|---|---|-----|-----|
| 0   |   |   |   |   |   |   |   |   |     |     |
| 1   |   |   |   | X |   |   |   |   |     | 3   |
| 2   |   |   |   | X |   |   |   |   |     | 3   |
| 3   |   |   |   |   |   |   |   |   |     |     |
| 4   |   |   |   |   |   |   |   |   |     |     |
| 5   |   |   |   | X |   |   |   |   |     | 3   |
| 6   |   |   |   | X |   |   |   |   |     | 3   |
| 7   |   |   |   |   |   |   |   |   |     |     |
| Err |   |   |   |   |   |   |   |   |     |     |
| Adr |   |   |   |   |   |   |   |   |     |     |

To rectify this condition, further steps may be added to the "Page Error Correction" procedure as follows.

Hloc at 150 (again, referring to FIG. 15) is the horizontal location of the portion of data being examined. As can be seen in the above example, a number of horizontal locations may still have ECC error addresses at the end of the "Page Error Correction" procedure. In this case, Hloc may be set with the last error address encountered as all the portions of data are being examined without correction. Therefore, at the End 154 of the procedure, if Hloc was set at 152 and not cleared by block 151, then Hloc contains the address of a record containing a portion of data being examined when Hloc was set, which may be rewritten to correct any errors contained within the record, and the "Page Error Correction" procedure may be repeated. When a condition such as seen in Table 8 exists, the addresses of the marked horizontal ECC segments may be used, but not the ECC error addresses of the Vertical ECC segments, because multiple errors may cause the error addresses to be incorrect, as can be seen in Table 3.

Similarly, if the flag at 150 was set and not cleared prior to completing the "Page Error Correction" procedure, then errors may remain. These errors may be corrected by adding more Fix records. Therefore, in another embodiment, at the End 154 of the "Page Error Correction" procedure, if the flag was set at node 152 and not cleared by block 151, then an additional Fix record may be added, and the "Page Error Correction" procedure may be repeated.

Figure 16A:
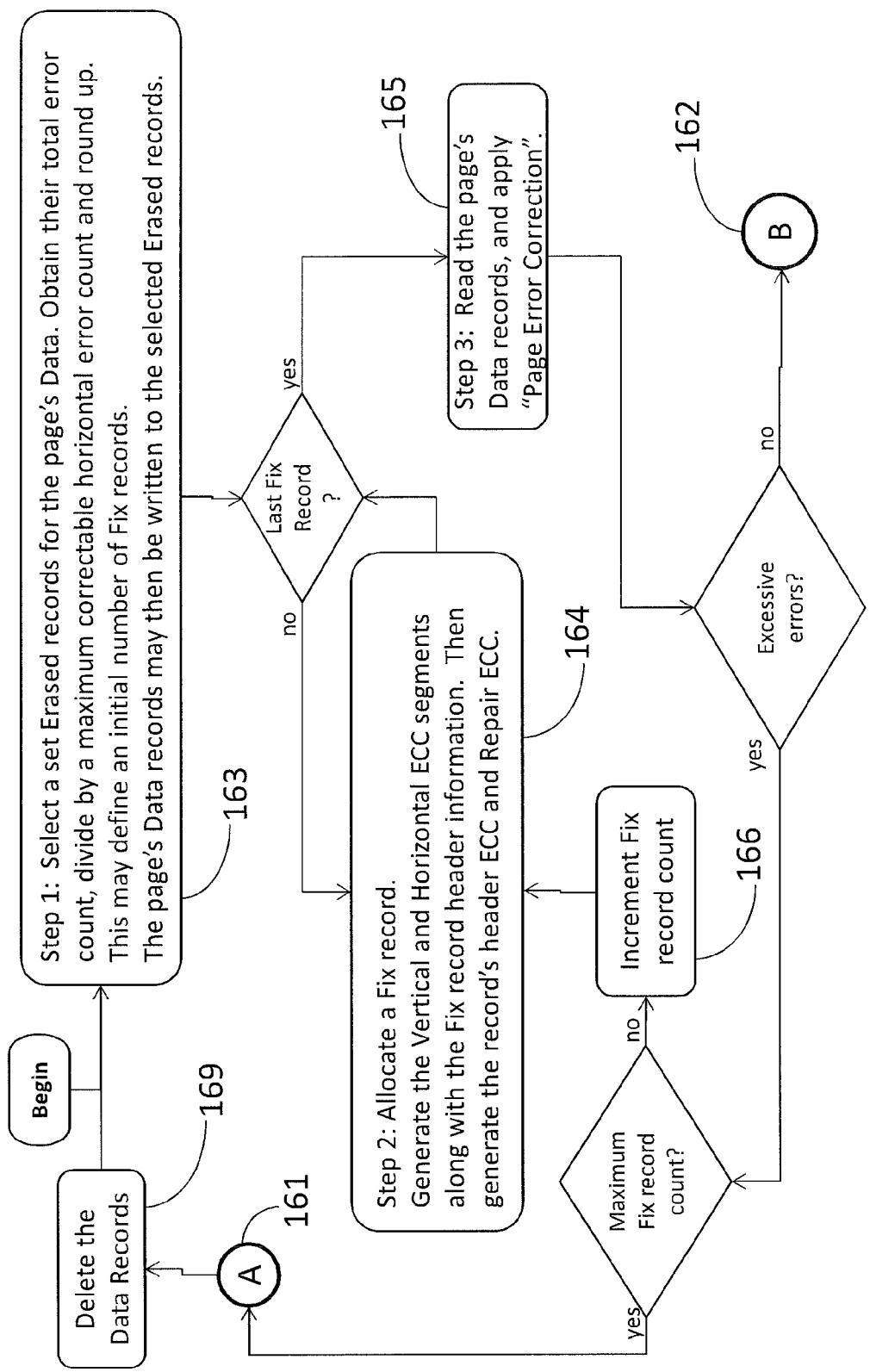
FIGS. 16a and b are parts of a flowchart of a process to write a page of data into potentially defective records.
Figure 16B:
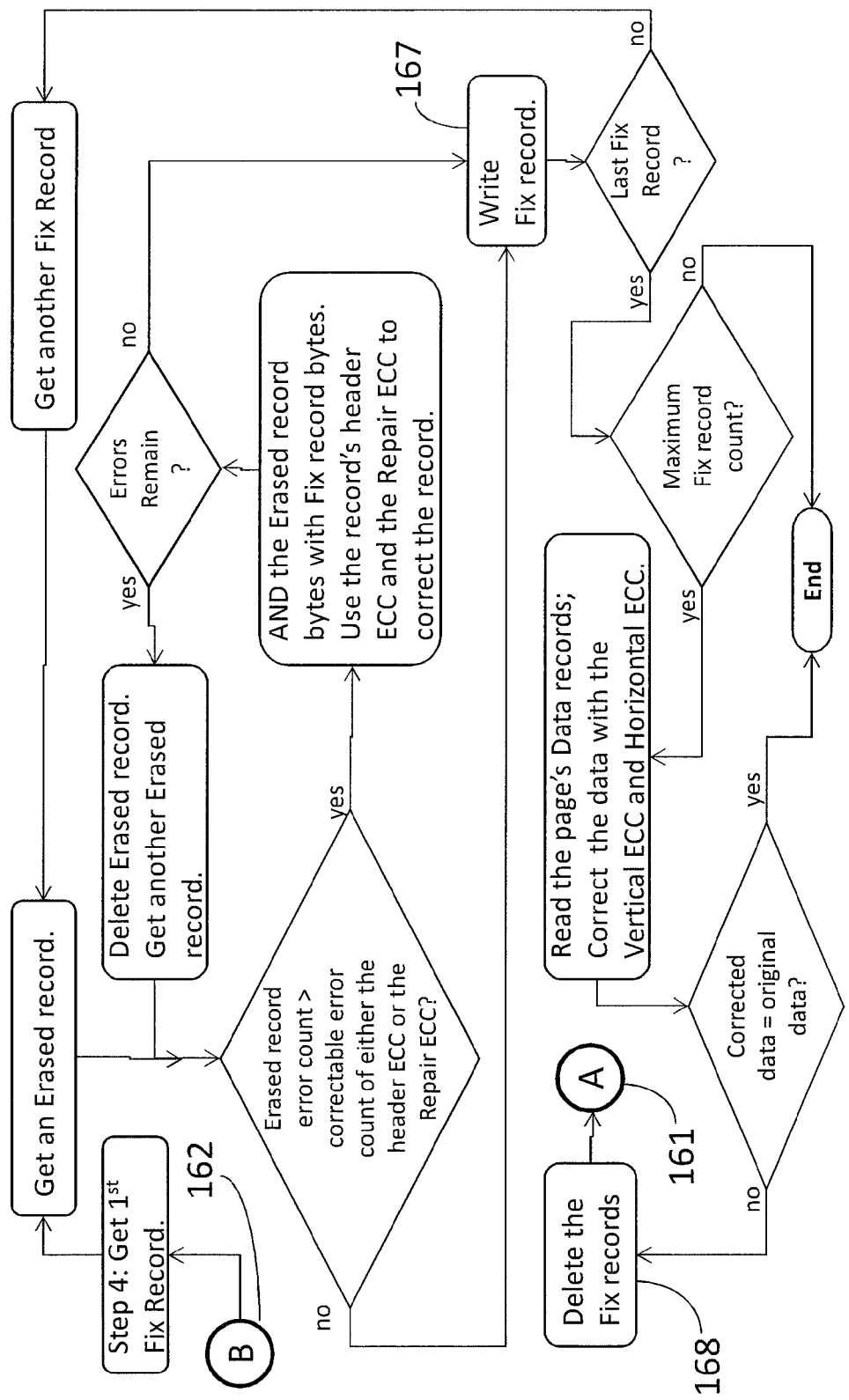

In yet another embodiment, a process to write a page of data into potentially defective records using the "Page Error Correction" process may be seen in the flowchart in FIGS. 16a and 16b, which are connected via connectors 161 and 162. The process may involve writing the Data records and determining the number of Fix records from the page's error count 163, creating the Fix records 164, applying "Page Error Correction" 165, and adding Fix records if necessary 166, as shown in FIG. 16a. If there are still errors and too many fix records, the data records may be deleted 169, and the procedure may be repeated. Otherwise, the page's Fix records may be allocated and written out 167, as can be seen in FIG. 16b, and if errors still remain, then both the Data records 169 and Fix records 168 may be deleted, and the whole process may be repeated The above techniques, separately and/or together, may gracefully degrade the available storage in a NV memory as the write errors increase. As the number of Fix records increases, the available records for data decreases, but the written pages may still be correctable.

In yet another embodiment, a Bad record type (0000 in Table 1) may be included, and error count limits may be defined for the records. If so, then if Fix record limits are exceeded during a page read or write, the Used records may be marked as Bad, and if error count limits are exceeded after an erase, the record may be marked as Bad. It should be noted that such processes may result in "retrieving" Bad records because their error count was reduced below the maximum in subsequent erases. As such, blocks and pages may also have maximum error counts that, if exceeded, may result in all the records in that block or page being marked Bad.

Finally, in another embodiment, given the amount of used storage, which may be defined as the count of the Data records, and the amount of unused storage, which may be defined as the count of the Deleted and Erased records, the amount of available storage may be defined as the sum of the Used and unused (i.e., not Used) storage, and the amount of bad storage may be defined as the count of Bad records; then, if the amount of available storage falls below some limit, or if the amount of bad storage rises above some limit, the control logic may send its host a bad memory warning.

It should be noted that the above procedures do not necessarily require that all records within a logically addressed page reside within the same block. As a result, erasing a block may result in displacement of part, but not necessarily all, of a logically addressed page's records. It is expected that, over time, a page's records may be physically scattered over a wide physical area.

It will be appreciated by persons skilled in the art that the processes and procedures presented hereinabove may be implemented either, in hardware, in software, or in some combination of both hardware and software. Furthermore, the hardware may be composed of one or more chips, where the control logic 35, serial compare logic 33, associated registers 36, 37 and 38, and interface logic 34 as shown in FIG. 3, may be implemented in custom, ASIC or FPGA chips, and the software may reside within a controller residing in the control logic 35 or in an external host processor.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A method of performing error correction on a set of serial bits comprising $2^N$ bits of serial data followed by one bit of checksum followed by N bits of error correction data, wherein N is a positive integer, the method comprising:
   shifting the bits of serial data into a shift register;
   using an exclusive-OR of the checksum with a generated checksum of all the bits of serial data residing in the shift register to set or clear a corresponding number of bits in a circular shift register (CSR);
   successively, for each of the N bits of error correction data, applying an exclusive-OR of each bit of error correction data with a corresponding generated bit of error correction data to a shift of the CSR to halve a number of set bits within the CSR; and
   exclusive-ORing the bits of serial data residing in the shift register with the corresponding bits residing in the CSR to correct the bits of serial data.

2. A device for serially receiving a set of serial bits comprising $2^N$ bits of serial data followed by one bit of checksum followed by N bits of error correction data and correcting the $2^N$ bits of serial data, wherein N is a positive integer, the device comprising:
   a $2^N$ bit serial shift register connected to a serial input;
   a $2^N$ bit serial error-correction code (ECC) generation device;
   a $2^N$ bit circular shift register (CSR) with a CSR input, each bit of the CSR being connected to an AND function of a previous bit's output and to one of the CSR input and an inverse of the CSR input, wherein a number of the AND functions using the CSR input is equal to a number of AND functions using the inverse of the CSR input;
   $2^N$ exclusive-OR gates, each with inputs from one of the circular shift register bits and one of the shift register bits, and each having a respective output; and
   a single exclusive-OR gate whose output is a function of the serial input and the output of the ECC generation device, and which is configured to drive the CSR input;
   wherein the checksum is the exclusive-OR of all the bits of serial data; and
   wherein the device is configured to serially receive the checksum, the serial data bits and the error correction data and to generate corrected data on the outputs of the $2^N$ exclusive-OR gates.

* * * * *